(12) United States Patent
Yamaguchi

(10) Patent No.: US 6,879,020 B2
(45) Date of Patent: Apr. 12, 2005

(54) SEMICONDUCTOR DEVICE

(75) Inventor: Yasuo Yamaguchi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/718,720

(22) Filed: Nov. 24, 2003

(65) Prior Publication Data
US 2004/0245598 A1 Dec. 9, 2004

(30) Foreign Application Priority Data
Jun. 3, 2003 (JP) .......................................... 2003-157762

(51) Int. Cl.[7] .............................................. H01L 29/00
(52) U.S. Cl. ...................... 257/529; 257/173; 257/626; 257/643; 257/649; 257/665; 257/910
(58) Field of Search ................................. 257/173, 529, 257/626, 629–652, 665, 910

(56) References Cited

U.S. PATENT DOCUMENTS 6,531,757 B2 * 3/2003 Shiratake .................... 257/529

FOREIGN PATENT DOCUMENTS

| JP | 63-84122 | 4/1988 |
| JP | 11-224900 | 8/1999 |
| JP | 2001-35876 | 2/2001 |

* cited by examiner

Primary Examiner—Andy Huynh
(74) Attorney, Agent, or Firm—Oblon, Spivak, McClelland, Maier & Neustadt, P.C.

(57) ABSTRACT

Via-shaped copper interconnect lines (2) buried in an interlayer insulating film (8) are connected to gate interconnect lines (1) in the lowermost layer. A copper interconnect line (6) of a shield ring (5) is buried in the interlayer insulating film (8), closer to outside than the copper interconnect lines (2). A silicon nitride film (9) is provided on the via-shaped copper interconnect lines (2), on the copper interconnect line (6) of the shield ring (5), and on the interlayer insulating film (8). Provided on the silicon nitride film (9) is a silicon oxide film (10) which holds therein a fuse line (3) for connecting different ones of copper interconnect lines (2). The silicon oxide film (10) is also provided on the upper surfaces of the fuse line (3) and the aluminum interconnect line (7). A silicon nitride film (11) is provided on the silicon oxide film (10). The silicon nitride film (11) defined over the fuse line (3) is removed, thereby creating an opening (4). The silicon nitride film (11) and the aluminum interconnect line (7) are directly connected.

6 Claims, 3 Drawing Sheets

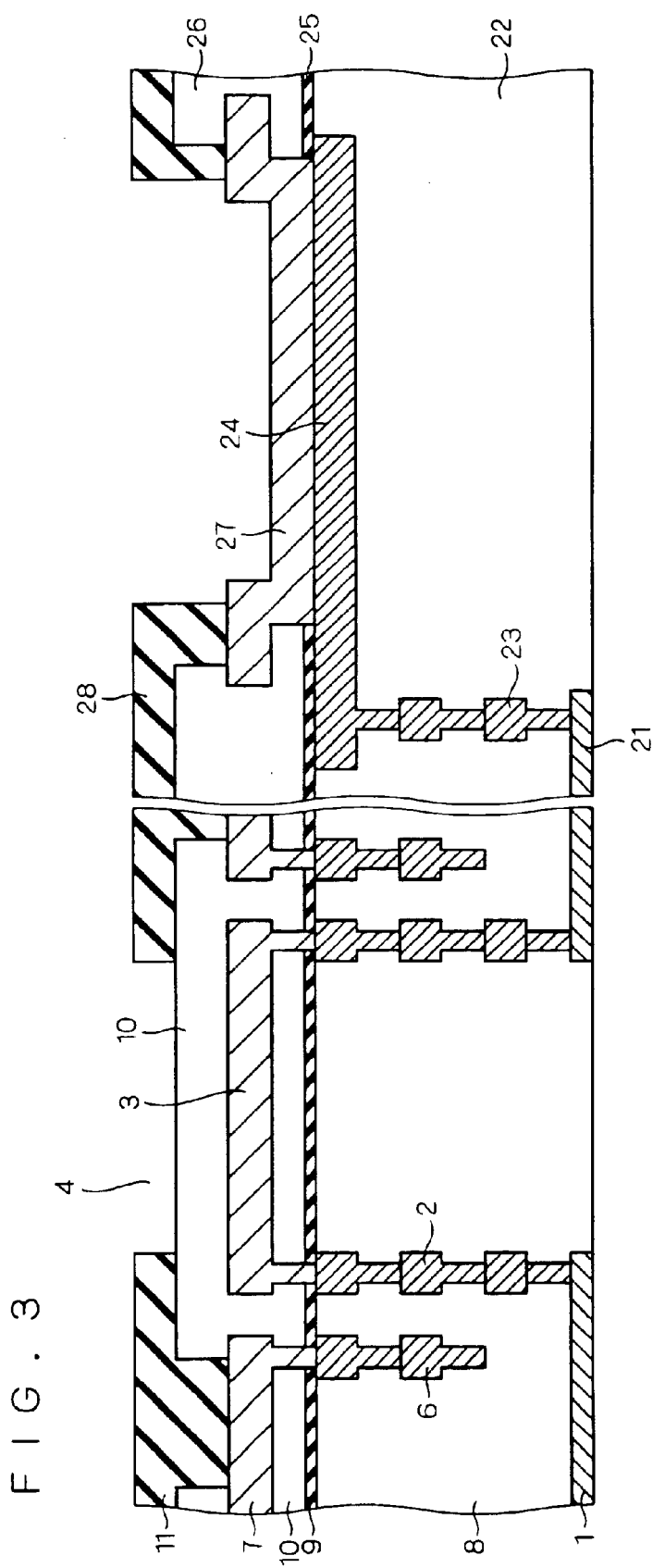

SEMICONDUCTOR DEVICE

BACKGROUND OF THE INVENTION

1. Field of the Invention

The present invention relates to a semiconductor device, and more particularly, to a semiconductor device including a fuse structure and a pad structure exhibiting excellence in durability.

2. Description of the Background Art

In an attempt to improve speed and functionality of various types of electronic devices, a CMOS (complementary metal oxide semiconductor) device has been experiencing shrinkage according to a scaling law to enhance delay performance of a transistor. Aluminum having low resistance and good stability has continuously been used as an interconnect material of the CMOS device. However, shrinkage to a greater degree reduces the equivalent resistance of a transistor. As a result, limitations have been imposed on the performance of a transistor by the resistance of aluminum as an interconnect material. In response, aluminum has been replaced by copper in recent years as an interconnect material.

A conventional fuse structure will be discussed. Copper interconnect lines connected to gate interconnect lines, for example, are buried an interlayer insulating film. An aluminum interconnect line for forming a fuse structure is buried in a silicon oxide film provided on the interlayer insulating film. The copper interconnect lines are connected by the aluminum interconnect line. Provided on the silicon oxide film is polyimide or the like. An exemplary fuse structure is introduced in Japanese Patent Application Laid-Open No. 11-224900 (1999) (pp. 3–4 and FIGS. 1–8). According to the fuse structure introduced therein, a fuse link and an electrode pad are provided in the same layer on a Cu dual damascene interconnect line. Further, an interlayer insulating film and a passivation film form a two-layer structure on the fuse link.

Next, a conventional pad structure will be discussed. A copper interconnect line connected to a gate interconnect line, for example, is buried in an interlayer insulating film. An aluminum electrode pad is provided on the copper interconnect line to be in direct contact therewith. The electrode pad is partially buried in a silicon oxide film on the interlayer insulating film. Provided on the silicon oxide film is polyimide or the like.

The conventional fuse and pad structures cause the problems as follows. A semiconductor device may be subjected to a reliability test under high humidity and high temperature conditions. The reliability test under such conditions is generally called as a pressure-cooker test. When a semiconductor device having the conventional fuse and pad structures experiences the pressure-cooker test, water enters from a silicon oxide film, causing the problem such as deterioration in performance of an interconnect line of the semiconductor device, or expansion of the silicon oxide film itself.

In the fuse structure introduced in Japanese Patent Application Laid-Open No. 11-224900 (1999), a two-layer structure including an interlayer insulating film and a passivation film is formed on a fuse link. A silicon oxide film poor in resistance to humidity is thus prevented from being exposed to outside, to avoid the foregoing problems. On the other hand, a silicon nitride film used as a passivation film has absorbency of a laser beam for blowing. Further, such a silicon nitride film causes multiple reflection when it forms a composite with a silicon oxide film. These problems, when they occur on a fuse line, interferes with laser blow, causing difficulty in formation of a fuse structure exhibiting excellence in manufacturing margin. That is, only a silicon nitride film having excellence in permeability is desirably provided on a fuse line.

SUMMARY OF THE INVENTION

It is an object of the present invention to provide a semiconductor device allowing excellence in resistance to humidity, controlling characteristic fluctuation to a low level, and providing high reliability, while exhibiting excellence in manufacturing margin in its structure.

According to the present invention, the semiconductor device includes a silicon oxide film, a fuse line, a metal interconnect line, and a protective film. The silicon oxide film is provided over an underlying layer. The fuse line is buried in the silicon oxide film, and forms a fuse. The metal interconnect line is buried in the silicon oxide film and the underlying layer to surround the fuse line. The metal interconnect line constitutes a shield ring. The protective film is provided on the silicon oxide film. The protective film has resistance to humidity. An opening is created in the protective film which is defined over the fuse line, whereby the silicon oxide film is exposed. The protective film is in part directly connected to an upper surface of the metal interconnect line without holding the silicon oxide film therebetween.

The shield ring divides the silicon oxide film into a section exposed to outside, and an unexposed section. As a result, entry of impurities such as water is stopped at the shield ring without causing further entry into the semiconductor device, leading to improvement in resistance to humidity. Further, a silicon nitride film is not defined over the fuse line, thereby providing excellence in manufacturing margin in constructing a structure. Still further, resistance to a crack generated in laser blow can be enhanced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional view illustrating a semiconductor device according to a second preferred embodiment of the present invention.

DESCRIPTION OF THE PREFERRED EMBODIMENTS

First Preferred Embodiment

Figure 1:
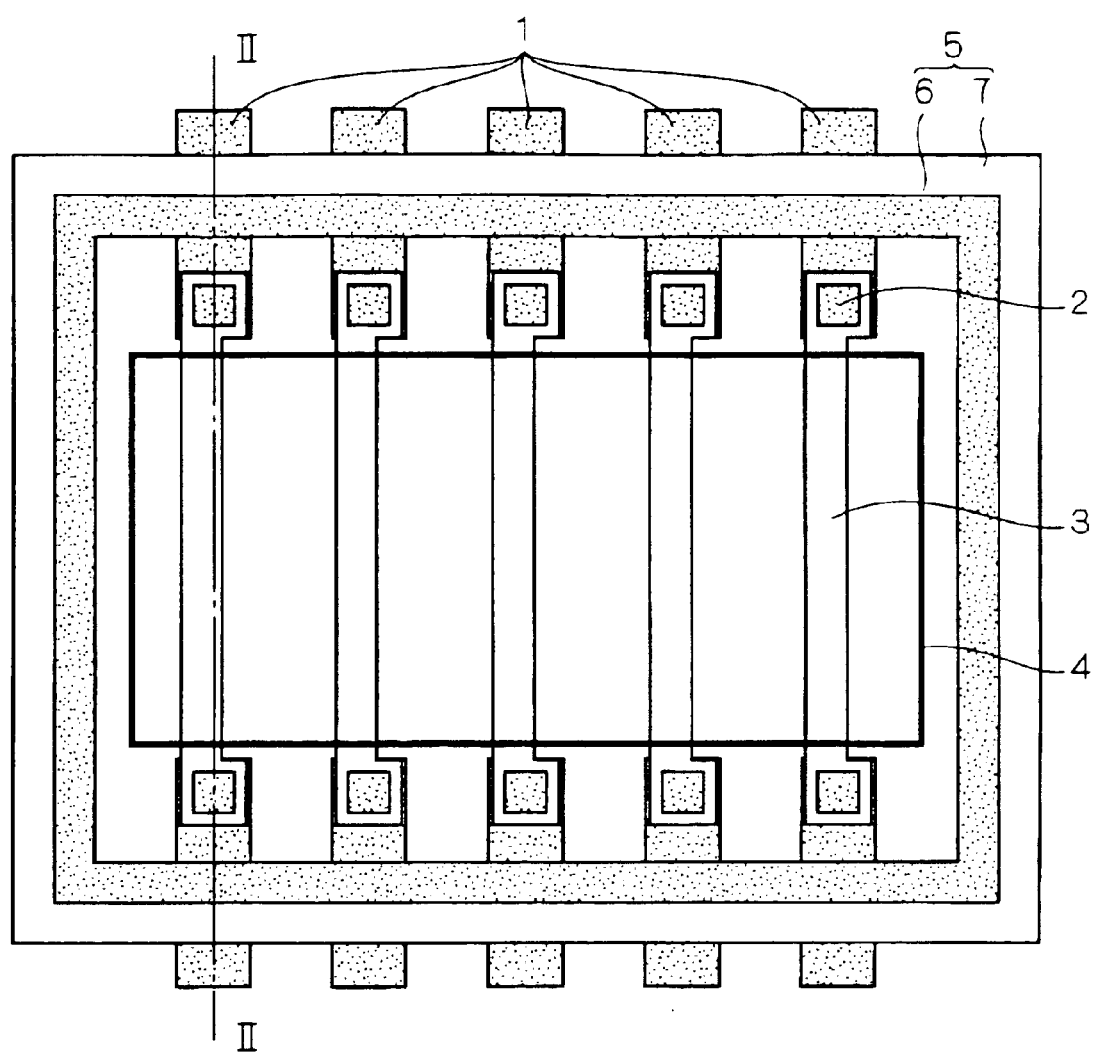
FIG. 1 is a plan view illustrating a semiconductor device according to a first preferred embodiment of the present invention.

FIG. 1 is a plan view illustrating a semiconductor device according to a first preferred embodiment of the present invention. In FIG. 1, ten gate interconnect lines 1 are shown including five extending upward, and five extending downward in the plane of the drawing. The upper and lower gate interconnect lines 1 are connected to fuse lines 3 through respective via-shaped copper interconnect lines 2. Although not shown in FIG. 1, a silicon nitride film is provided in the uppermost level. An opening 4 is created in this silicon nitride film which is defined over the fuse lines 3. With further reference to FIG. 1, a shield ring 5 is provided to surround the fuse lines 3. The shield ring 5 has a two-layer structure including a copper interconnect line 6 and an aluminum interconnect line 7 thereon.

The shield ring 5 is operative in the following manner. A fuse is damaged when it is subjected to laser blow. According to a degree of damage, a crack may be generated in a film holding the fuse therein such as a silicon oxide film. In response, the shield ring 5 is provided as a wall to surround the fuse. The provision of the shield ring 5 stops a crack in situ generated by a laser blow, thereby preventing the crack from entering into other regions.

Figure 2:
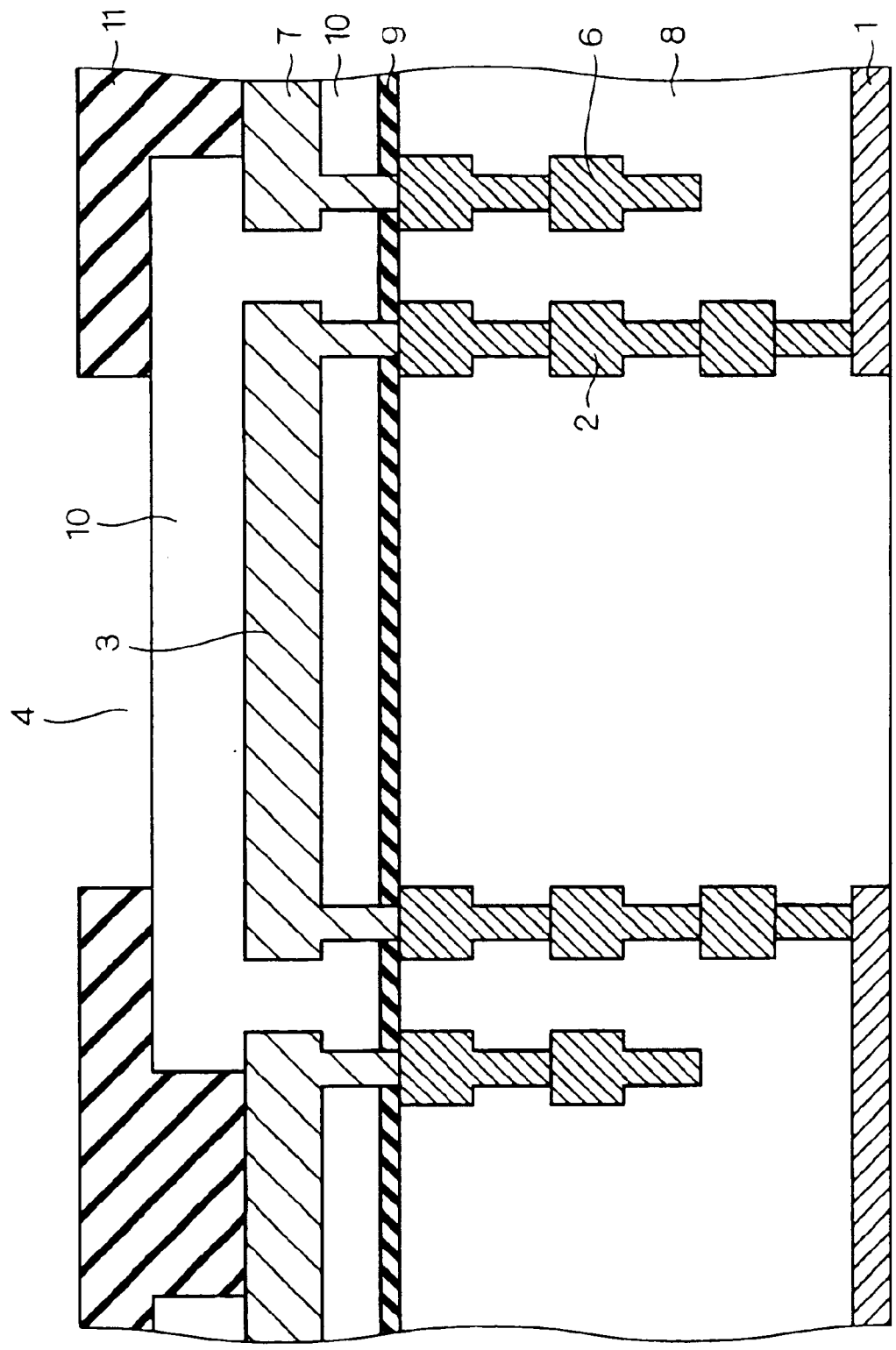
FIG. 2 is a sectional view illustrating the semiconductor device according to the first preferred embodiment of the present invention.

FIG. 2 is a sectional view illustrating the semiconductor device of the first preferred embodiment, taken along a cutting line II—II in FIG. 1. With reference to FIG. 2, the via-shaped copper interconnect lines 2 buried in an interlayer insulating film 8 are connected to the gate interconnect lines 1 in the lowermost layer. The copper interconnect line 6 of the shield ring 5 is buried in the interlayer insulating film 8, closer to outside than the copper interconnect lines 2. The gate interconnect lines 1 and the shield ring 5 are shown to overlap with each other in plan view, whereas the copper interconnect line 6 is not connected to the gate interconnect lines 1.

A silicon nitride film 9 is provided on the copper interconnect lines 2 and 6, and on the interlayer insulating film 8. The silicon nitride film 9 as a passivation film is operative to prevent diffusion of copper from the copper interconnect lines 2 and 6, and to prevent entry of impurities such as water from outside. Provided on the silicon nitride film 9 is a silicon oxide film 10 which holds therein the fuse line 3 for connecting different ones of copper interconnect lines 2. The fuse line 3 is an aluminum line. The silicon nitride film 9 is removed in areas where the fuse line 3 and the copper interconnect lines 2 are to be connected, thereby electrically connecting the fuse line 3 and the copper interconnect lines 2. The aluminum interconnect line 7 of the shield ring 5 is also buried in the silicon oxide film 10, and is connected to the copper interconnect line 6. The silicon nitride film 9 is also removed in areas where the aluminum interconnect line 7 and the copper interconnect line 6 are to be connected.

The silicon oxide film 10 is also provided on the upper surfaces of the fuse line 3 and the aluminum interconnect line 7. A silicon nitride film 11 is provided on the silicon oxide film 10. The silicon nitride film 11 defined over the fuse line 3 is removed, thereby creating the opening 4. The silicon oxide film 10 defined over the aluminum interconnect line 7 is also removed, thereby directly connecting the silicon nitride film 11 and the aluminum interconnect line 7. For making connection between the silicon nitride film 11 and the aluminum interconnect line 7, the aluminum interconnect line 7 should be greater in width than the one used for forming the conventional fuse structure.

Next, exemplary dimensions of the constituent elements of the fuse structure according to the first preferred embodiment will be given in detail. The silicon nitride film 11 and the silicon oxide film 10 defined on the fuse line 3 respectively have thicknesses of about 4 $\mu$m and about 1 $\mu$m. The fuse line 3, the silicon oxide film 10 defined under the fuse line 3, and the silicon nitride film 9 respectively have thicknesses in the ranges of about 300 nm to 1500 nm, about 200 nm to 500 nm, and about 50 nm to 4000 nm. The silicon oxide film 10 removed on the aluminum interconnect line 7 of the shield ring 5 has a width in the range of about 0.5 $\mu$m to 10 $\mu$m. The aluminum interconnect line 7 has a width in the range of about 0.6 $\mu$m and 12 $\mu$m. The copper interconnect lines 2 and 6, in the generation of 0.13 $\mu$m devices, each have a thickness in the range of about 250 nm to 1.5 $\mu$m. The minimum possible width of the copper interconnect lines 2 and 6 is about 0.16 $\mu$m.

As described, the semiconductor device according to the first preferred embodiment comprises the silicon oxide film 10, the fuse line 3, the copper interconnect line 6 and the aluminum interconnect line 7, and the silicon nitride film 11. The silicon oxide film 10 is provided over the interlayer insulating film 8 as an underlying layer through the silicon nitride film 9. The fuse line 3 is buried in the silicon oxide film 10, and forms a fuse. The copper interconnect line 6 and the aluminum interconnect line 7 are buried in the interlayer insulating film 8 and the silicon oxide film 10, respectively, to surround the fuse line 3. The copper interconnect line 6 and the aluminum interconnect line 7 constitute the shield ring 5. The silicon nitride film 11 is provided on the silicon oxide film 10. The silicon nitride film 11 has resistance to humidity. The opening 4 is created in the silicon nitride film 11 which is defined over the fuse line 3 to expose the silicon oxide film 10. The silicon nitride film 11 is in part directly connected to the upper surface of the aluminum interconnect line 7 without holding the silicon oxide film 10 therebetween. That is, the shield ring 5 divides the silicon oxide film 10 into a section exposed to outside, and an unexposed section. As a result, entry of impurities such as water is stopped at the shield ring 5 without causing further entry into the semiconductor device, leading to improvement in resistance to humidity. Further, the silicon nitride film 11 is not defined over the fuse line 3, thereby providing excellence in manufacturing margin in constructing a structure. Still further, resistance to a crack generated in laser blow can be enhanced.

In the fuse structure of the first preferred embodiment, the silicon nitride film 9 is formed on the interlayer insulating film 8 due to use of the copper interconnect lines 2 and 6. However, when the interconnect material includes an alternative to copper or an alloy of copper such as aluminum, the present invention does not necessarily require the silicon nitride film 9. Further, the fuse line 3 is not necessarily an aluminum line as in the first preferred embodiment. Alternatively, the fuse line 3 may be a composite film including aluminum, a Tin/AlCu/Tin film, or a copper film.

The first preferred embodiment provides the silicon nitride film 11 in the uppermost level. Such an uppermost layer may alternatively be a composite of a silicon nitride and silicon oxide films, or a polyimide film, as long as it is operative to serve as a protective film having resistance to humidity. When a composite of silicon nitride and silicon oxide films is employed, the silicon nitride film should be at least 50 nm or more in thickness to provide sufficient resistance to humidity. As described, the shield ring 5 divides the silicon oxide film 10 into a section exposed to outside, and an unexposed section. According to such a protective film having resistance to humidity, entry of impurities such as water is thus stopped at the shield ring 5 without causing further entry into the semiconductor device, leading to improvement in resistance to humidity.

Second Preferred Embodiment

FIG. 3 is a sectional view illustrating a semiconductor device according to a second preferred embodiment of the present invention. In FIG. 3, a fuse area and a pad area are shown, of which the fuse area has the same structure as described in the first preferred embodiment. That is, in the fuse area of FIG. 3, the via-shaped copper interconnect lines 2 buried in the interlayer insulating film 8 are connected to the gate interconnect lines 1 in the lowermost layer. The copper interconnect line 6 of the shield ring 5 is buried in the interlayer insulating film 8, closer to outside than the copper interconnect lines 2. The gate interconnect lines 1 and the shield ring 5 are shown to overlap with each other in plan view, whereas the copper interconnect line 6 is not connected to the gate interconnect lines 1.

The silicon nitride film 9 is provided on the copper interconnect lines 2 and 6, and on the interlayer insulating film 8. The silicon nitride film 9 as a passivation film is operative to prevent diffusion of copper from the copper interconnect lines 2 and 6, and to prevent entry of impurities such as water from outside. Provided on the silicon nitride film 9 is the silicon oxide film 10 which holds therein the fuse line 3 for connecting different ones of copper interconnect lines 2. The fuse line 3 is an aluminum line. The silicon nitride film 9 is removed in areas where the fuse line 3 and the copper interconnect lines 2 are to be connected, thereby electrically connecting the fuse line 3 and the copper interconnect lines 2. The aluminum interconnect line 7 of the shield ring 5 is also buried in the silicon oxide film 10, and is connected to the copper interconnect line 6. The silicon nitride film 9 is also removed in areas where the aluminum interconnect line 7 and the copper interconnect line 6 are to be connected.

The silicon oxide film 10 is also provided on the upper surfaces of the fuse line 3 and the aluminum interconnect line 7. The silicon nitride film 11 is provided on the silicon oxide film 10. The silicon nitride film 11 defined over the fuse line 3 is removed, thereby creating the opening 4. The silicon oxide film 10 defined over the aluminum interconnect line 7 is also removed, thereby directly connecting the silicon nitride film 11 and the aluminum interconnect line 7.

Turning to the pad area of FIG. 3, a gate interconnect line 21 in the lowermost layer is connected to a via-shaped copper interconnect line 23 buried in an interlayer insulating film 22. The copper interconnect line 23 is connected to a flat copper interconnect line 24 buried in the upper surface of the interlayer insulating film 22. The gate interconnect lines 1 in the fuse area and the gate interconnect line 21 in the pad area are formed in the same plane. The interlayer insulating film 8 in the fuse area and the interlayer insulating film 22 in the pad area form a single continuous interlayer insulating film.

A silicon nitride film 25 is provided over the copper interconnect line 24 and the interlayer insulating film 22. The silicon nitride film 25 as a passivation film is operative to prevent diffusion of copper from the copper interconnect line 24, and to prevent entry of impurities such as water from outside. Provided on the silicon nitride film 25 is a silicon oxide film 26. The silicon nitride film 9 in the fuse area and the silicon nitride film 25 in the pad area form a single continuous silicon nitride film. The silicon oxide film 10 in the fuse area and the silicon oxide film 26 in the pad area form a single continuous silicon oxide film.

An aluminum electrode pad 27 is buried in the silicon oxide film 26. The electrode pad 27 has a bottom surface electrically connected to the copper interconnect line 24. For such electrical connection, the silicon nitride film 25 and the silicon oxide film 26 defined at the bottom surface of the electrode pad 27 are removed. Provided on the silicon oxide film 26 is a silicon nitride film 28. That is, the electrode pad 27 is arranged in an opening which is created in the silicon oxide film 26 and the silicon nitride film 28.

The silicon nitride film 28 is directly connected to the electrode pad 27 to prevent exposure of the silicon oxide film 26 to outside in the pad area. For such direct connection to the electrode pad 27, the silicon nitride film 28 in part covers side surfaces of the opening created in the silicon oxide film 26. With reference to FIG. 3, the silicon nitride film 28 has end portions which cover the silicon oxide film 26 to make connection to the electrode pad 27. The silicon nitride film 11 in the fuse area and the silicon nitride film 28 in the pad area form a single continuous silicon nitride film.

As described, the semiconductor device according to the second preferred embodiment has an fuse area and a pad area. The fuse area comprises the silicon oxide film 10, the fuse line 3, the copper interconnect line 6 and the aluminum interconnect line 7, and the silicon nitride film 11. The silicon oxide film 10 is provided over the interlayer insulating film 8 as an underlying layer through the silicon nitride film 9. The fuse line 3 is buried in the silicon oxide film 10, and forms a fuse. The copper interconnect line 6 and the aluminum interconnect line 7 are buried in the interlayer insulating film 8 and the silicon oxide film 10, respectively, to surround the fuse line 3. The copper interconnect line 6 and the aluminum interconnect line 7 constitute the shield ring 5. The silicon nitride film 11 is provided on the silicon oxide film 10. The silicon nitride film 11 has resistance to humidity. The opening 4 is created in the silicon nitride film 11 which is defined over the fuse line 3 to expose the silicon oxide film 10. The silicon nitride film 11 is in part directly connected to the upper surface of the aluminum interconnect line 7 without holding the silicon oxide film 10 therebetween. The pad area comprises the electrode pad 27 provided in an opening which is created in the silicon oxide film 26 and the silicon nitride film 28. The silicon nitride film 28 in part covers side surfaces of the opening created in the silicon oxide film 26 to make direct connection to the electrode pad 27. That is, in the fuse area, the shield ring 5 divides the silicon oxide film 10 into a section exposed to outside, and an unexposed section. Entry of impurities such as water is thus stopped at the shield ring 5 without causing further entry into the semiconductor device. In the pad area, exposure of the silicon oxide film 26 to outside is prevented. As a result, resistance to humidity is improved. Further, the silicon nitride film 11 is not defined over the fuse line 3, thereby providing excellence in manufacturing margin in constructing a structure. Still further, resistance to a crack generated in laser blow can be enhanced.

In the fuse and pad structures of the second preferred embodiment, the silicon nitride films 9 and 25 are respectively formed on the interlayer insulating films 8 and 22 due to use of the copper interconnect lines 2, 6, 23 and 24. However, when the interconnect material includes an alternative to copper or an alloy of copper such as aluminum, the present invention does not necessarily require the silicon nitride films 9 and 25. Further, the fuse line 3 and the electrode pad 27 are not necessarily an aluminum line and an aluminum electrode pad, respectively, as in the second preferred embodiment. Alternatively, the fuse line 3 and the electrode pad 27 may each be a composite film including aluminum, a Tin/AlCu/Tin film, or a copper film.

The second preferred embodiment provides the silicon nitride films 11 and 28 in the uppermost level. Such an uppermost layer may alternatively be a composite of a silicon nitride and silicon oxide films, or a polyimide film, as long as it is operative to serve as a protective film having resistance to humidity. When a composite of silicon nitride and silicon oxide films is employed, the silicon nitride film should be at least 50 nm or more in thickness to provide sufficient resistance to humidity.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a silicon oxide film provided over an underlying layer;

a fuse line buried in said silicon oxide film, said fuse line forming a fuse;

a metal interconnect line buried in said silicon oxide film and said underlying layer to surround said fuse line, said metal interconnect line constituting a shield ring; and a protective film provided on said silicon oxide film, said protective film having resistance to humidity, wherein an opening is created in said protective film which is defined over said fuse line, whereby said silicon oxide film is exposed, and wherein said protective film is in part directly connected to an upper surface of said metal interconnect line without holding said silicon oxide film therebetween.

2. The semiconductor device according to claim 1, further comprising:

an electrode pad provided in an opening which is created in said silicon oxide film and said protective film, wherein said protective film in part covers a side surface of said opening created in said silicon oxide film, to make direct connection to said electrode pad.

3. The semiconductor device according to claim 1, further comprising:

a silicon nitride film provided between said underlying layer and said silicon oxide film.

4. The semiconductor device according to claim 1, wherein said protective film is a silicon nitride film.

5. The semiconductor device according to claim 1, wherein said protective film is a composite of a silicon nitride film and a silicon oxide film, and wherein said silicon nitride film forming said composite is at least 50 nm or more in thickness.

6. The semiconductor device according to claim 1, wherein said protective film is a polyimide film.

* * * * *